US007466131B1

(12) United States Patent
Xu et al.

(10) Patent No.: US 7,466,131 B1
(45) Date of Patent: Dec. 16, 2008

(54) SYSTEM AND METHOD FOR DESIGNING MULTI-CHANNEL RF PULSES FOR MR IMAGING

(75) Inventors: Dan Xu, Springfield, IL (US); Kevin F. King, Menomonee Falls, WI (US); Zhi-Pei Liang, Champaign, IL (US)

(73) Assignees: General Electric Company, Schenectady, NY (US); The Board of Trustees of the University of Illinois, Urbana, IL (US)

( * ) Notice: Subject to any disclaimer, the term of this patent is extended or adjusted under 35 U.S.C. 154(b) by 43 days.

(21) Appl. No.: 11/738,225

(22) Filed: Apr. 20, 2007

(51) Int. Cl.
*G01V 3/00* (2006.01)
(52) U.S. Cl. ...................................... 324/318
(58) Field of Classification Search ......... 324/300–322; 600/407–455, 548, 554
See application file for complete search history.

(56) References Cited

U.S. PATENT DOCUMENTS

| | | | | |
|---|---|---|---|---|
| 6,534,983 | B1 * | 3/2003 | Boskamp et al. | 324/318 |
| 6,541,971 | B1 * | 4/2003 | Dannels | 324/309 |
| 6,906,518 | B2 * | 6/2005 | Leussler | 324/318 |
| 7,282,915 | B2 * | 10/2007 | Giaquinto et al. | 324/318 |
| 7,301,341 | B2 * | 11/2007 | Hargreaves et al. | 324/307 |
| 2005/0007110 | A1 * | 1/2005 | Zhou | 324/307 |
| 2008/0012564 | A1 * | 1/2008 | Lin | 324/309 |

OTHER PUBLICATIONS

J. Pauly, D. Nishimura, and A. Macovski, "A k-space analysis of small-tip-angle excitation", J. Magn. Reson., vol. 81, pp. 43-56, 1989.
J. Pauly, D. Nishimura, and A. Macovski, "A linear class of large-tip-angle selective excitation pulses", J. Magn. Reson., vol. 82, pp. 571-587, 1989.
S. Saekho, C.-Y. Yip, D. C. Noll, F. E. Boada, and V. A. Stenger, "Fast-kz three-dimensional tailored radiofrequency pulse for reduced B1 inhomogeneity", Magn. Reson. Med., vol. 55, pp. 719-724, 2006.
U. Katscher, P. Börnert, C. Leussler, and J. S. Van Den Brink, "Transmit SENSE", Magn. Reson. Med., vol. 49, pp. 144-150, 2003.
Y. Zhu, "Parallel excitation with an array of transmit coils", Magn. Reson. Med., vol. 51, pp. 775-784, 2004.
W. A. Grissom. C.-Y. Yip, Z. Zhang, V. A. Stenger, J. A. Fessler, and D. C. Noll, "Spatial domain method for the design of RF pulses in multicoil parallel excitation", Magn. Reson. Med., vol. 56, pp. 620-629, 2006.
Z. Zhang, C.-Y. Yip, W. A. Grissom, F. E. Boada, D. C. Noll, and V. A. Stenger, "Reduction of B1 inhomogeneity using transmit SENSE slice-select pulses", in Proc. 14th Ann. Meet. Intl. Soc. Mag. Reson. Med., p. 602, Seattle, Washington, May 2006.

* cited by examiner

*Primary Examiner*—Brij B Shrivastav
(74) *Attorney, Agent, or Firm*—Ziolkowski Patent Solutions Group, SC

(57) ABSTRACT

A system and method are provided for designing RF pulses for multi-channel and/or multi-dimensional spatially-selective applications using a linear approximation. Embodiments of the system and method may use a generalized linear-class large tip angle approximation to design RF pulses for multi-channel and parallel transmission. Further, some of these approximations allow for the design of arbitrarily large flip angles, irregularly-shaped flip angle profiles, or arbitrary initial magnetization values. Embodiments of the system and method may also provide for the design of k-space trajectories which aid in maintaining assumptions of the various linear class approximations.

20 Claims, 5 Drawing Sheets k-SPACE TRAJECTORY

DESIRED FLIP ANGLE

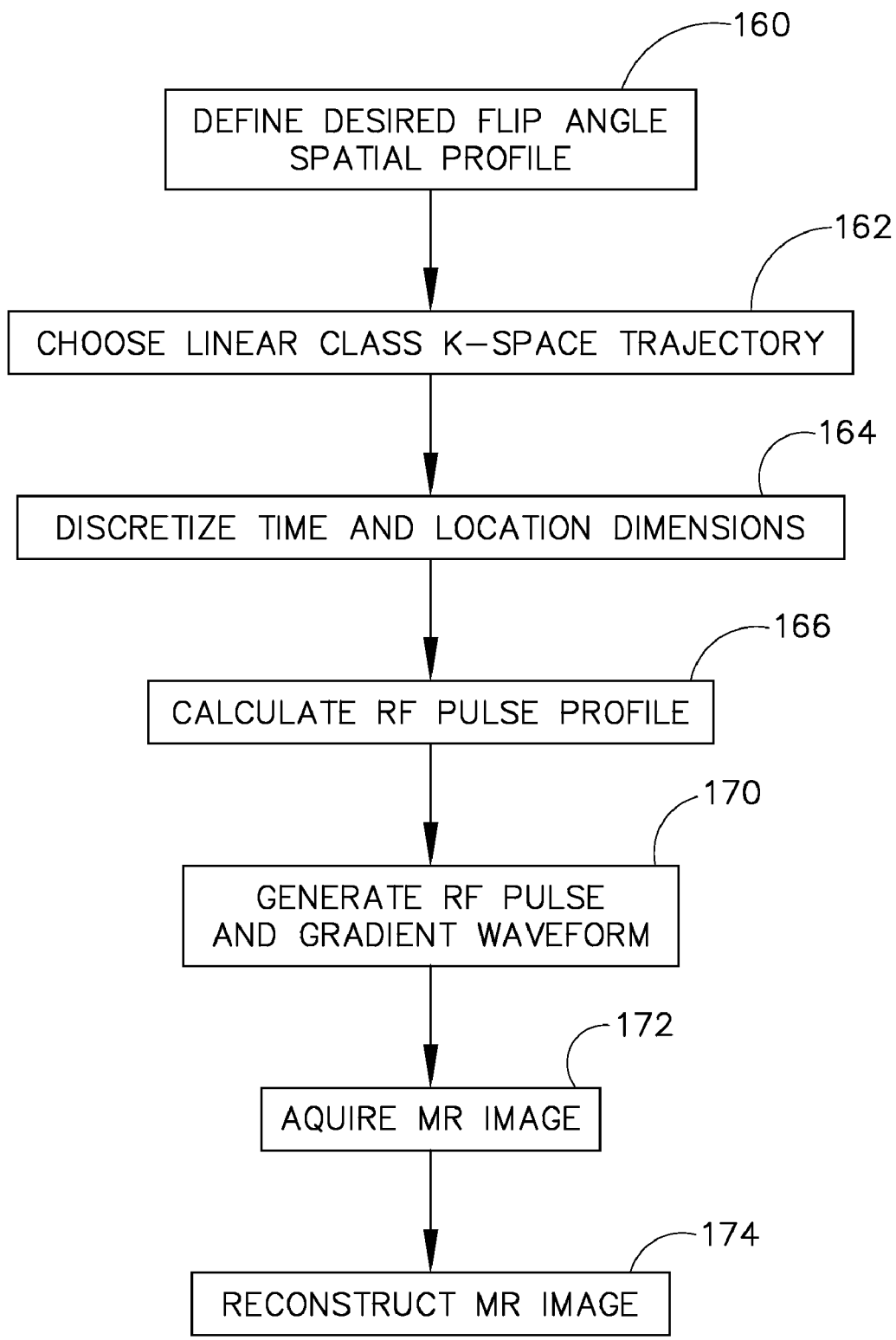

SYSTEM AND METHOD FOR DESIGNING MULTI-CHANNEL RF PULSES FOR MR IMAGING

BACKGROUND OF THE INVENTION

The present invention relates generally to magnetic resonance (MR) imaging, and more specifically, to a system and method for designing multi-channel and multi-dimensional spatially selective radio frequency (RF) pulse profiles using a linear approximation approach. By utilizing a linear class large tip angle approximation, it is possible to design RF pulses having non-uniform or non-separable flip angle profiles with arbitrarily large magnitudes. In addition, such an approach can account for arbitrary initial magnetizations, MR imaging in general is based upon the principle of nuclear magnetic resonance. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field, such as a $B_1$ excitation field, which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

During a transmit sequence, an MR system will transmit RF pulses of given frequencies having particular profiles while various magnetic field gradients are being applied. For example, in a spin-echo based sequence, an MR system would transmit an excitation pulse at a particular frequency and transmit power for a particular time, in order to induce a net transverse magnetization in nuclei of a scan subject. Subsequent pulses transmitted by the system may have the same or a similar frequency, but might have different gain, amplitude, and duration attributes to cause a different change in magnetization (or "flip angle") in order to cause spin echoes. Thus, in general, the particular shapes of the RF pulses in a transmit sequence are varied to manipulate the net magnetization in nuclei of the scan subject.

The attributes of RF pulses can be adjusted such that only spins within a given two dimensional (2 D) or three-dimensional (3 D) portion of a scan subject are affected. This is useful in such techniques as reduced field of view imaging or spatially-selective imaging. However, RF pulses which selectively excite nuclei in 2 D or 3 D locations can often have a long duration and/or a complex shape. The long duration tends to make the use of these conventionally-designed RF pulses inefficient or ineffective, due to phase accumulation from off resonant spins and $T_2$ decay. Presently, multidimensional spatially-selective pulses are designed using approximation techniques, such as the small tip angle (STA) approximation, the linear class large tip angle (LCLTA) approximation, and techniques based upon echo planar imaging (EPI) trajectories.

The duration of multi-dimensional spatially-selective pulses can be decreased when multiple transmit channels are available, such as through parallel transmission. In parallel transmission, each coil exhibits a spatially different sensitivity pattern and is driven by an independently controlled RF waveform. Transmission time reduction is achieved by causing the pulses to undersample excitation k-space. One method of undersampling is known as "acceleration" of the pulses. For example, in a spiral k-space trajectory, an acceleration could be an increase in the distance between spiral turns of the trajectory. If no compensation is made for the undersampling, the resulting magnetization can be significantly degraded by aliasing caused by the excited field of view being too small. However, with multiple transmit channels, compensation for the acceleration is possible by including information from the spatial profile of the transmit coils in the design of the RF pulse in lieu of the omitted k-space information.

So far, parallel transmission has only been explored using pulses designed with the STA method. However, STA is limited to small tip angles and begins to produce significant error around 90 degrees. LCLTA and EPI-based approaches are generally used for larger tip angles. However, the feasibility of extending these methods to multiple transmission channels is so far unknown.

In addition, the EPI-based approaches are generally based on an assumption that the desired magnetization profile is separable, as is the case with cylindrical or square slab profiles. In other words, a multidimensional RF pulse can be designed using an EPI-based approach by designing lower dimensional pulses along different dimensions. For example, a 2 D pulse could be designed using 1 D sinc or Shinnar-Le Roux along each dimension. A 3 D pulse could be designed using combinations of 1 D and 2 D pulses. However, EPI-based design techniques may not be applicable in some cases, such as when a curved slice or an irregularly shaped region of interest is being imaged. Moreover, Cartesian k-space trajectories, such as used in EPI-based techniques, have been shown to be less SAR and RF power efficient than some non-Cartesian trajectories, such as spirals.

In contrast, the LCLTA design approach is more general than both the STA and EPI-based techniques, in part because there is no special requirement on the desired magnetization profile and a large class of non-Cartesian k-space trajectories can be used. The LCLTA approach generalizes the STA method so that initial magnetization can be arbitrary and larger flip angles can be created. This property allows designing a large-tip-angle pulse through concatenating a sequence of small-excitation pulses, when certain conditions or assumptions are met.

It would therefore be desirable to have a system and method capable of quickly producing multi-channel, multi-dimensional spatially selective RF pulse waveforms of arbitrary flip angles. It would be further desirable for such system and method to be general enough to account for arbitrary initial magnetizations and arbitrarily shaped magnetization profiles, e.g. by utilizing the LCLTA design approach.

BRIEF DESCRIPTION OF THE INVENTION

Embodiments of the present invention provide for the design and implementation of multi-channel RF pulses. According to various embodiments of the invention, RF pulse waveforms of arbitrary flip angles can be quickly generated for multi-channel transmission using linear class approximations. Overall scan efficiency and image quality can be improved when the pulses are generated quickly and transmitted on a multi-channel coil assembly.

Therefore, in accordance with one aspect of the invention, an MRI system includes a plurality of gradient coils, and RF transceiver system and switch, and a system control. The plurality of gradient coils is positioned about a bore of a magnet and the RF transceiver system and switch are controlled by a pulse module to transmit RF signals to a multi-channel RF coil assembly to acquire MR images. The system control is operatively connected to the pulse module and is programmed to receive user parameters describing a desired RF pulse. From the parameters, the system control is programmed to create a linear class large tip angle (LCLTA) waveform representing the desired RF pulse for the multi-channel RF coil assembly. The system control then causes the pulse module to transmit the waveform via the multi-channel RF coil assembly to acquire MR image data. The MR image data is at least temporarily stored in memory.

In accordance with another aspect of the invention, a method for MR imaging is disclosed. The method includes designing at least one multi-channel, multi-dimensional spatially-selective RF pulse using a linear approximation for an arbitrary initial magnetization. The method also includes defining a k-space trajectory to maintain at least one assumption of the linear approximation. The at least one multi-channel, multi-dimensional spatially-selective RF pulse is then transmitted to acquire MR data according to the k-space trajectory. The MR image data is used to reconstruct an MR image for display to a user.

In accordance with a further aspect of the invention, a computer-readable storage medium has a set of instructions stored thereon which, when executed by a computer, cause the computer to characterize a waveform for a multi-channel, multi-dimensional spatially-selective RF pulse using a linear equation. The instructions further cause the computer to determine a refocusing k-space trajectory for the waveform and instruct an MR apparatus to transmit an RF pulse according to the waveform and the k-space trajectory. MR data resulting from transmission of the RF pulse is then acquired by the computer.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 7 is a flowchart setting forth a technique for MR imaging in accordance with an embodiment of the present invention.

DETAILED DESCRIPTION OF THE PREFERRED EMBODIMENT

Figure 1:
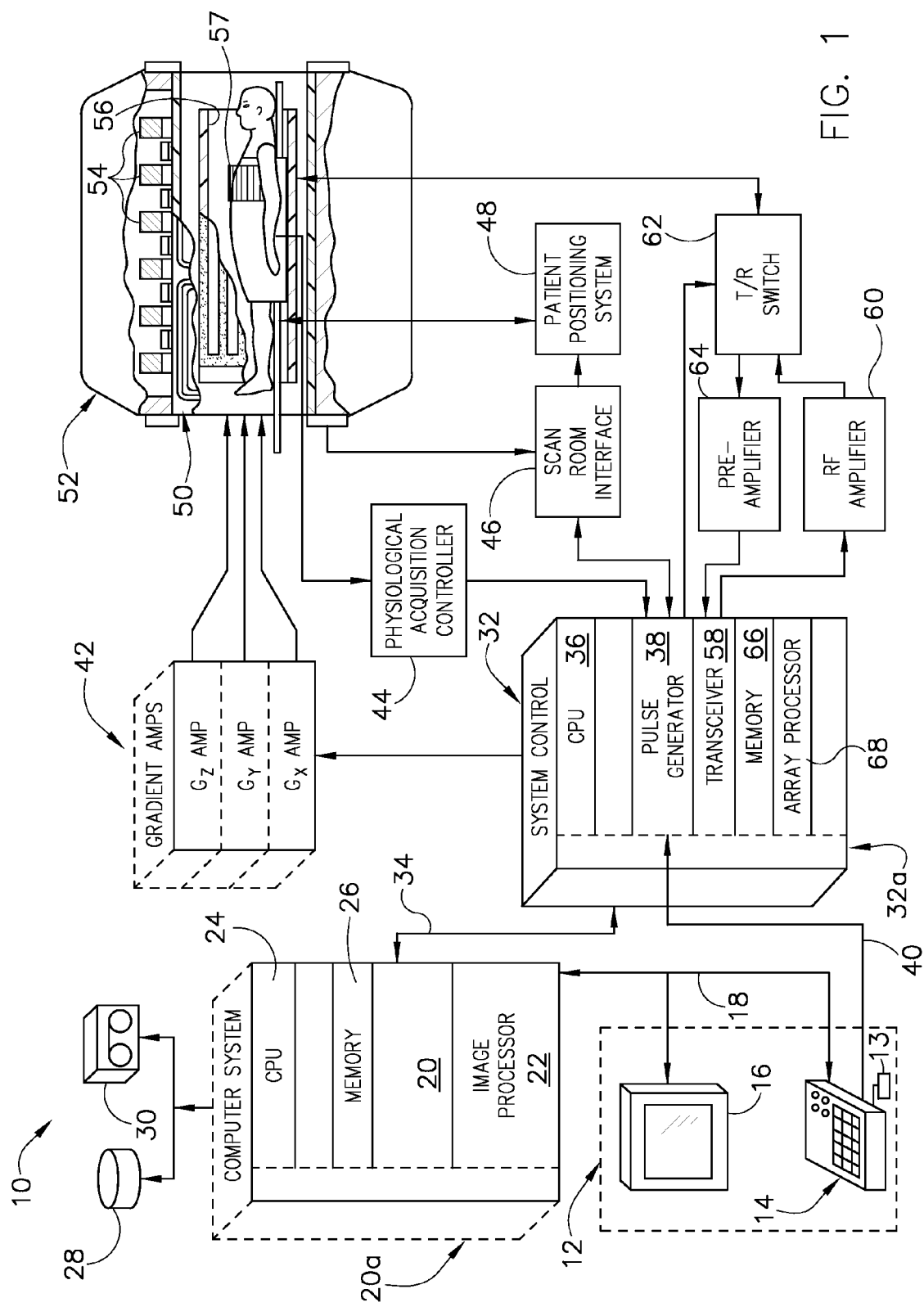
FIG. 1 is a schematic block diagram of an MR imaging system for use with embodiments of the present invention.

Referring to FIG. 1, the major components of a magnetic resonance imaging (MRI) system 10 that may incorporate embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56, and may include a surface or parallel RF coil assembly 57. A transceiver module 58 in the system control 32 produces pulses which are amplified by an RF amplifier 60 and coupled to the RF coil 56 or the coil assembly 57 by a transmit/receive switch 62. The resulting signals emitted by the excited nuclei in the patient may be sensed by the same RF coil 56 or coil assembly 57 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 or the coil assembly 57 during the transmit mode and to connect the preamplifier 64 to the coil 56 or the coil assembly 57 during the receive mode.

The MR signals picked up by the RF coil 56 or the coil assembly 57 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

To design RF pulse shapes for transmission by the MR system 10 described above (or by a similar or equivalent system for obtaining MR images), a linear-class large tip angle (LCLTA) approximation may be used. Such an approximation uses a linear equation to express the non-linear Bloch equations. Thus, an LCLTA approach to defining an RF pulse profile, ignoring $T_1$ and $T_2$ relaxations, may take the form of:

$$\theta(r) = \gamma \int_0^T B_1^*(t) e^{-ik(t) \cdot r} dt \qquad \text{Eqn. 1}$$

where $\gamma$ is the gyromagnetic ratio, T is the pulse duration, and $\theta(r)$ represents the flip angle of the pulse $B_1(t)$ at a spatial location r for a time t. The spatial location r may be a vector of x, y, and/or z positions so that Eqn. 1 can be extended for two-dimensional (2 D) and three-dimensional (3 D) pulse design. The function k(t) represents the chosen k-space trajectory, and may be expressed as:

$$k(t) = -\gamma \int_t^T G(\tau) d\tau \qquad \text{Eqn. 2}$$

where $G(\tau)$ is the gradient waveform vector. Since this LCLTA approach is more general than an STA approach, the approximation of Eqn. 1 can account for arbitrary initial magnetization and larger flip angles.

This linear approximation holds true so long as the linear-class assumptions are met. For example, one set of linear-class assumptions may be that $B_1(t)$ is small, implying a small flip angle, and k(t) is inherently refocused. A k-space trajectory which starts and ends at the origin of k-space such that the flip angle of the corresponding RF pulse is real-valued, is one example of an "inherently refocused" trajectory. Another set of linear-class assumptions can exist where $B_1(t)$ is large, and thus can be decomposed into a series of sub-pulses, which each produce a component of the total magnetization. That is, large $B_1(t)$ waveforms can be sub-divided into portions which each produce a small rotation about the same axis in a net magnetization of a scan subject. Correspondingly, the k-space trajectory k(t) associated with such a $B_1(t)$ waveform in the linear-class assumption can be decomposed into a number of inherently-refocusing sub-trajectories. Thus, one skilled in the art will appreciate that a number of linear-class assumptions exist for a variety of arbitrary $B_1(t)$. Further, linear-class assumptions can also be applied for a variety of arbitrary flip angles.

Moreover, Eqn. 1 can be expanded to describe RF pulse waveforms for multi-channel transmission to account for a number l of independent transmit coils. The effective $B_1(t)$ field from a multi-channel RF coil assembly, such as coil array 57 of FIG. 1, can be expressed as:

$$B_1(r,t) = \sum_{l=1}^{L} s_l(r) B_1^{(l)}(t) \qquad \text{Eqn. 3}$$

where $s_l(r)$ is the sensitivity map for the lth coil of the multi-channel coil assembly and $B_1^{(l)}(t)$ is the RF pulse waveform to be transmitted by the lth coil. Substituting Eqn. 3 into Eqn. 1 yields:

$$\theta(r) = \gamma \sum_{l=1}^{L} s_l^*(r) \int_0^T B_1^{(l)*}(t) e^{-ik(t) \cdot r} dt \qquad \text{Eqn. 4}$$

The linear-class assumptions discussed above can still hold for Eqn. 4 so that the LCLTA approximation will be applicable. Thus, if one knows a desired flip angle for all positions in a region of interest (ROI), the gyromagnetic constant, the sensitivity mapping for all coils, and the k-space trajectory, a corresponding multi-channel RF pulse waveform can be found. In addition, it should be noted that Eqn. 4 poses no practical constraints on the shape of the desired flip angle profile $\theta(r)$ of the RF pulse and is general enough to be applicable despite an arbitrary initial magnetization which may exist in the ROI.

To solve Eqn. 4 for pulse waveform design, a number of techniques may be used. For example, one way to easily solve Eqn. 4 for $B_1^{(1)}(t)$ is to discretize the time t over the duration of the pulse T and solve for each the waveform at every voxel or position in the ROI ($r_0$ to $r_p$) for each t from 0 to (N−1) Δt, where NIT is the sample rate and Δt is the interval between each value. Using such a direct discretization method can avoid some limitations on the k-space trajectory and certain approximation errors due to k-space gridding. In addition, discretizing locations in the ROI and/or discretizing the time axis may significantly reduce computation time. When discretized and expressed in a matrix form with terms for each unique t and r, inversion, pseudoinversion, and regularization techniques may be used to solve for the RF pulse waveform. One skilled in the art will appreciate, however, that Eqn. 4 is solvable in a number of alternative ways and may be solved continuously over all t or with discretization.

As discussed above, there are a number of ways to maintain the various assumptions of RF pulse design approximations. For example, some approximations will hold when the maximum desired flip angle is kept to a relatively small value. A set of linear class assumptions can be maintained for larger flip angles by selecting a given k-space trajectory that is inherently refocusing or that is decomposable into sub-trajectories which are each individually refocusing. For example, for a 2 D spatially-selective pulse and/or a pulse in which $\theta(r)$ is constrained to a relatively small flip angle, an inherently refocusing k-space trajectory may be used.

Figure 3:
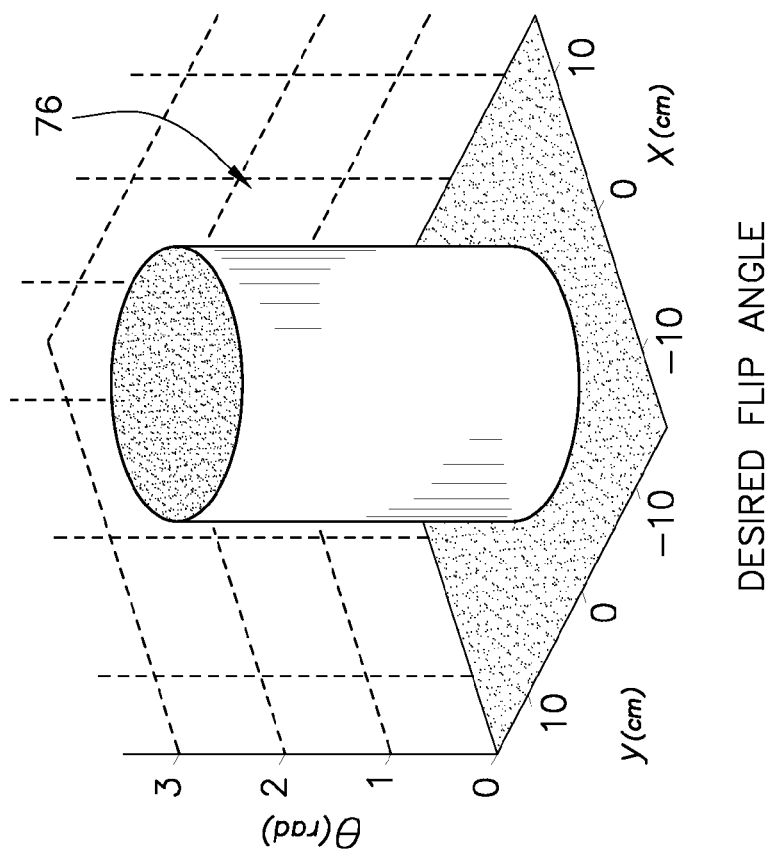
FIG. 3 is a plot of a target magnetization profile for a multi-channel multi-dimensional spatially-selective RF pulse.
Figure 2:
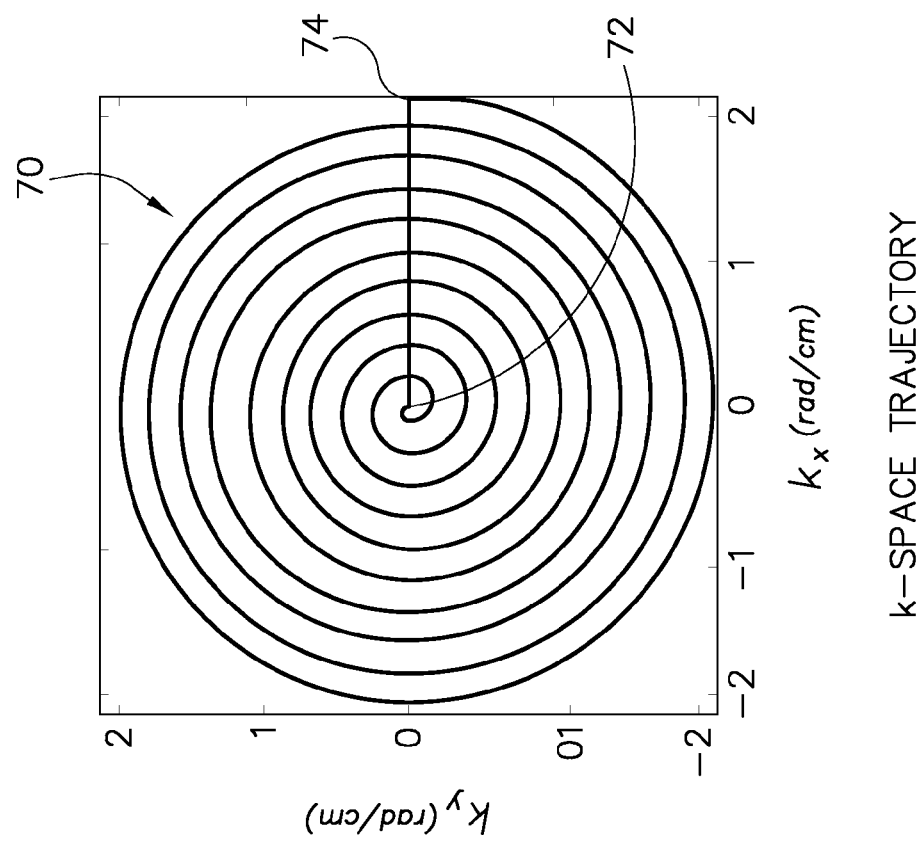
FIG. 2 is a graph of a 2 D inherently refocusing k-space trajectory.

FIGS. 2 and 3 depict one example of an inherently refocusing k-space trajectory 70 for a cylindrically-shaped desired ROI or flip angle profile 76. For example, trajectory 70 of FIG. 2 may be used for a 2 D spatially-selective 180 degree refocusing pulse to acquire a spin echo. As shown, trajectory 70 begins at an origin 72 of the k-space and spirals outward to a periphery 74 of k-space. Therefore, trajectory 70 can be considered a non-Cartesian trajectory. Before the trajectory 70 ends, the acquisition "blips" or shifts back to the origin 72 of k-space. Therefore, no net phase change is created by the gradients which cause the trajectory 70 to take place, and no pre-winder or re-winder phase gradients are necessary. When used in a multi-channel or parallel transmission application, the trajectory may be designed to have an acceleration factor. In other words, the distance between spiral turns of trajectory 70 may be increased, resulting in an undersampling of the k-space and reduced transmission time. In any event, given the desired flip angle profile 76 of FIG. 3 and knowing the transmit sensitivities for each coil of a multi-coil array, the refocusing k-space trajectory 70 of FIG. 2 can be used in Eqn. 4 to design an RF pulse waveform using an LCLTA approach. One skilled in the art will appreciate, however, that other flip angle profiles and inherently refocusing trajectories may be used in conjunction with Eqn. 4 to solve for other RF pulse waveforms.

Figure 4:
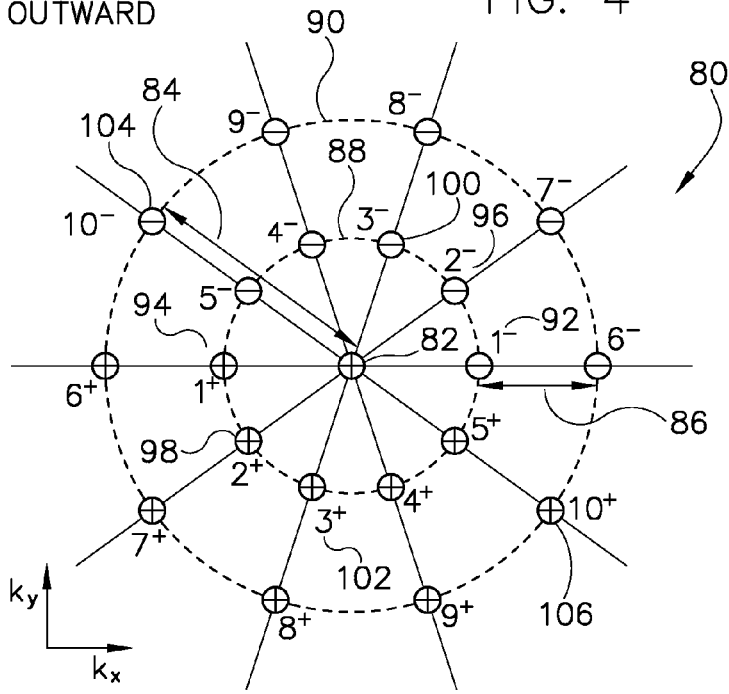
FIG. 4 is a view in the kx-ky plane of a 3 D k-space trajectory.
Figure 5:
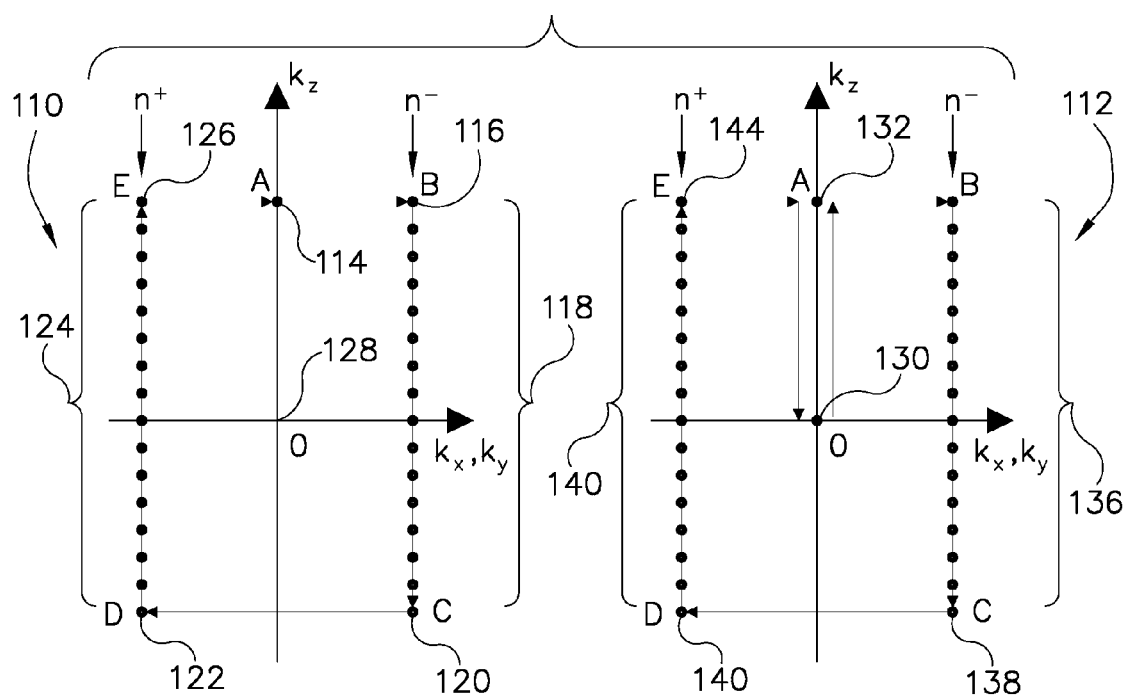
FIG. 5 is a comparison plot of a cross-section of the 3 D k-space trajectory of FIG. 4 and a cross-section of the equivalent inherently refocusing k-space trajectory.
Figure 6:
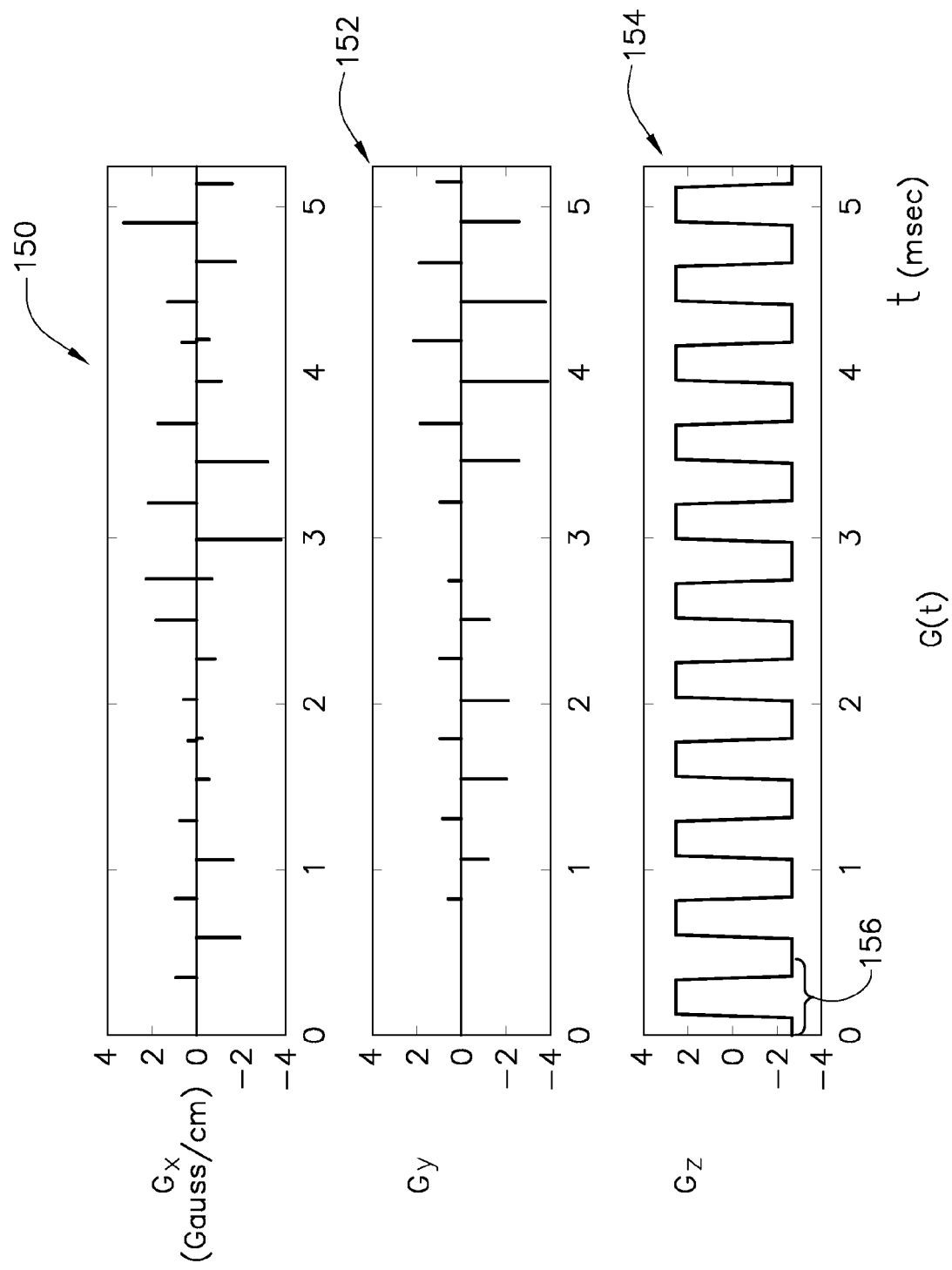
FIG. 6 is a graph of gradient waveforms to achieve the k-space trajectory of FIG. 4.

For a 3 D spatially-selective RF pulse and/or a pulse having a relatively larger flip angle, a k-space trajectory may be decomposed into sub-trajectories which are each refocusing. Referring now to FIGS. 4-6, an example of such an embodiment of the invention is shown. For purposes of discussion, a desired flip angle profile will again be assumed to be cylindrically shaped, though it is appreciated that other, non-separable, asymmetric, and/or non-uniform flip angle profiles can be inputs in designing RF pulse waveforms according to embodiments of the present invention. FIG. 4 shows an end view of a 3 D cylindrical k-space 80 having a central axis at 82. The k-space trajectory shown in FIG. 4 includes two concentric rings 88, 90. The distance 84 between the center 82 of the k-space 80 and the outer ring 90 is 4π times the field of view (FOV). The distance 86 between the inner ring 88 and the outer ring 90 is 2π times the FOV. It is understood, however, that other spacings between the rings of the trajectory, as well as more or fewer rings, are possible. For example, the k-space trajectory of FIG. 4 may be designed to have an acceleration, or undersampling, by reducing the number of sub-trajectories in each ring 88, 90 or increasing the separation 84, 86 between the rings.

In contrast to the trajectory of FIG. 2, the k-space trajectory of FIG. 4 does not need to begin at the origin or center 82 of k-space 80. Rather, the trajectory may begin at a first concentric position 92. K-space sampling may proceed along the transverse dimension of the 3 D k-space 80 (i.e. "inwardly" as depicted), then blip or shift to a corresponding concentric position 94 symmetrically about the center 82 of the k-space 80. Sampling may then resume along the transverse dimension of the k-space, in the opposite direction (i.e. "outwardly" as depicted), then blip or shift back to the first concentric position 92. The result is a sub-trajectory of two symmetric lines of k-space acquisition through the 3 D k-space 80 at positions 92 and 94, but no net change in phase since the sub-trajectory started and stopped at the same position 92. The trajectory may then proceed to a second concentric position 96, sample inwardly, shift to a corresponding symmetric position 98, sample outwardly, and then return to second concentric position 96. Similarly, lines of k-space may be sampled at a third concentric position 100 and corresponding symmetric position 102. The trajectory may continue as such about the inner ring 88 and then about the outer ring 90, ending with samplings at a tenth concentric position 104 and corresponding symmetric position 106. When the samplings are acquired in pairs and each acquisition pair starts and ends at the same position, the samplings are refocusing sub-trajectories. When the refocusing sub-trajectories and are evenly distributed about concentric rings, as shown, the net phase change will be zero or negligible. In other words, the k-space trajectory of FIG. 4 will have the same effect as an inherently-refocusing k-space trajectory, and can therefore be used to maintain a linear-class assumption.

Referring now to FIG. 5, a cross-sectional view of a refocusing sub-trajectory 110 of the 3 D k-space trajectory of FIG. 4 and an inherently refocusing k-space trajectory 112 are shown in comparison. The refocusing sub-trajectory 110 represents a pair of ($n^-$, $n^+$) nodes of the trajectory of FIG. 4. As will be described with respect to FIG. 5, the inherently refocusing k-space trajectory 112 is substantially equivalent. Refocusing sub-trajectory 110 can begin at a central axis 114 corresponding to a center of k-space 128 or sub-trajectory 110 can begin at a concentric position 116. As shown, sub-trajectory 110 moves along the $k_z$ axis, densely sampling k-space 118 for a single $k_x$, $k_y$ position. When the sub-trajectory 110 reaches the opposite axial end of the k-space 120, acquisition then shifts or blips to a different, corresponding $k_x$, $k_y$ position 122. Corresponding position 120 is symmetrical about the central axis of the k-space 114. The sub-trajectory then densely samples k-space 124 upwardly as shown along the $k_z$ axis to a position 126 which symmetrically corresponds to the first concentric position 116. If sub-trajectory 110 began at the central axis 114, the sub-trajectory will return thereto. Alternatively, if sub-trajectory 110 began at concentric position 116, the sub-trajectory will shift back to concentric position 116.

In comparison to the refocusing sub-trajectory 110, an individually inherently refocusing k-space trajectory 112 starts and ends at a center of k-space 130. As shown, trajectory 112 moves from the center of k-space 130 upwardly along the $k_z$ axis to an axial point 132, then shifts along the $k_x$, $k_y$ axis to a concentric position 134. Dense sampling of k-space 136 takes place as the trajectory moves axially to a position 138 having the same $k_x$, $k_y$ value, but a different $k_z$ value. As in the refocusing sub-trajectory 110, the inherently refocusing trajectory 112 shifts to a symmetric position 140 and densely samples along an axial line 142 to a position 144 symmetrically corresponding to concentric position 134. Inherently refocusing trajectory 112 then shifts across the $k_x$, $k_y$ axis to the axial point 132 and then down to k-space origin 130. Since inherently refocusing trajectory 112 starts and ends at the origin 130, no prewinder or rewinder phase gradients are needed. When used in sequence with other concentrically distributed refocusing sub-trajectories, the net phase accumulation of refocusing sub-trajectory 110 will be offset and a similar effect to that of the inherently refocusing trajectory 112 will be achieved, i.e., no prewinder or rewinder gradients may be necessary.

FIG. 6 shows a graph of $G_x$, $G_y$, and $G_z$ waveforms to achieve a number of refocusing sub-trajectories for a 3 D acquisition as graphically represented in FIG. 4. As shown, the $G_x$, $G_y$ gradients 150, 152 operate in combination to position the trajectory in concentric positions about the origin of k-space. The $G_z$ gradient 154 operates to shift the trajectory axially through the 3 D k-space, in an "inward" and "outward" fashion, as described above. Therefore, $G_z$ gradient 154 is generally periodic, having an alternating high-to-low pattern 156.

Referring now to FIG. 7, a flowchart illustrating a technique for RF pulse design is shown. A user begins by selecting or otherwise defining the desired flip angle profile at block 160. This may take the form of a user entering one or more parameters, such as the desired pulse type, the pulse duration, the spatially-limited ROI, the desired pulse sequence, the desired magnetization change, and the like, which can be used to calculate a flip angle profile. Alternatively, a user may simply directly define the flip angle profile (graphically or numerically). At block 162, a user may then select the linear-class k-space trajectory to be used with the RF pulse being designed. As described above, a number of linear-class assumptions exist and a number of k-space trajectories will satisfy each. For LCLTA-designed RF pulses, a k-space trajectory may be inherently refocusing or a composite of multiple refocusing sub-trajectories. It is also appreciated that an MR system may simply proceed with default linear class assumptions and/or trajectories, which may depend upon the user-entered parameters at block 160. For reduced computational complexity, the time axis and spatial locations for the RF pulse to be designed can be discretized for a matrix form solution at block 164. Once sufficient parameters are identified for solving an equation which gives an RF waveform for each coil l of a multi-channel array, such as Eqn. 4, the MR system can calculate such solutions at block 166. The multi-channel, multi-dimensional spatially-selective RF waveforms produced at block 166 can be validated internally by the MR system, through experimentation, and/or can be presented to the user for confirmation. Once a user is satisfied with the result, the RF waveform can be sent to a pulse module for transmission by an RF coil array or other multi-channel coil assembly at block 170. Concurrently, the gradient waveforms which determine the selected linear class k-space trajectory are also played out at block 170. In this manner, the RF pulse transmitted at block 170 is a multi-dimensional spatially-selective RF pulse. Subsequently, MR data is acquired from the spins of interest using any of a number of known data acquisition techniques. From the MR data acquired by transmission of the RF waveform and gradient waveforms, an image of the scan subject can be reconstructed at block 174.

Therefore, it has been shown that embodiments of the invention can generate RF pulse waveforms for multi-channel and/or multi-dimensional spatially-selective applications. In addition, embodiments of the invention can allow for arbitrary flip angles and arbitrary initial magnetizations to be considered in using linear approximation techniques to quickly determine RF pulse waveforms. For example, some embodiments may utilize generalized multi-channel LCLTA design approaches for generating RF pulses. Thus, in implementation, a realized technical effect of embodiments the present invention is the ability to design and utilize multi-channel and/or multi-dimensional RF pulses for MR image acquisitions.

Accordingly, in one embodiment of the present invention, an MR system includes a plurality of gradient coils positioned about a bore of a magnet and an RF transceiver system and switch controlled by a pulse module to transmit RF signals to a multi-channel RF coil assembly to acquire MR images. The MR system also includes a system control operatively connected to the pulse module. The system control is programmed to receive user parameters describing a desired RF pulse and create a linear class large tip angle (LCLTA) waveform representing the desired RF pulse for the multi-channel RF coil assembly. The system control is further programmed to cause the pulse module to transmit the waveform via the multi-channel RF coil assembly to acquire MR image data and at least temporarily store the MR image data in memory.

In accordance with another embodiment, a method for MR imaging includes the steps of designing at least one multi-channel, multi-dimensional spatially-selective RF pulse using a linear approximation, for an arbitrary initial magnetization, and defining a k-space trajectory to maintain at least one assumption of the linear approximation. The method further includes transmitting the RF pulse to acquire MR data according to the k-space trajectory, reconstructing an MR image from the MR image data, and displaying the image to a user.

In accordance with another embodiment of the invention, a computer-readable storage medium having a set of instructions stored thereon is disclosed. The set of instructions, when executed by a computer, will cause the computer to characterize a waveform for a multi-channel, multi-dimensional spatially-selective RF pulse using a linear equation and determine a refocusing k-space trajectory for that waveform. The instructions will then cause the computer to instruct an attached MR apparatus to transmit an RF pulse in accordance with the waveform and k-space trajectory. The computer then acquires MR data resulting from transmission of the RF pulse.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging apparatus comprising:
   a plurality of gradient coils positioned about a bore of a magnet;
   an RF transceiver system and switch controlled by a pulse module to transmit RF signals to a multi-channel RF coil assembly to acquire MR images; and
   a system control operatively connected to the pulse module and programmed to:
      receive user parameters describing a desired RF pulse;
      create a linear class large tip angle (LCLTA) waveform representing the desired RF pulse for the multi-channel RF coil assembly;
      cause the pulse module to transmit the waveform via the multi-channel RF coil assembly to acquire MR image data; and
      at least temporarily store the MR image data in memory.

2. The MR imaging apparatus of claim 1 wherein the LCLTA waveform is multi-dimensional spatially-selective.

3. The MR imaging apparatus of claim 1 wherein the system control is further programmed to create and transmit the LCLTA waveform to maintain at least one linear-class assumption.

4. The MR imaging apparatus of claim 3 wherein the system control is further programmed to determine a k-space acquisition trajectory in accordance with the at least one linear-class assumption.

5. The MR imaging apparatus of claim 4 wherein the k-space acquisition trajectory is inherently refocusing.

6. The MR imaging apparatus of claim 4 wherein the k-space acquisition trajectory includes a plurality of refocusing sub-trajectories.

7. The MR imaging apparatus of claim of claim 1 wherein the user parameters include at least one of a large desired flip angle, an irregularly-shaped desired flip angle profile, and an arbitrary initial magnetization.

8. A method for MR imaging comprising:
   designing at least one multi-channel, multi-dimensional spatially-selective RF pulse using a linear approximation for an arbitrary initial magnetization;
   defining a k-space trajectory to maintain at least one assumption of the linear approximation;

transmitting the at least one multi-channel, multi-dimensional spatially-selective RF pulse to acquire MR data according to the k-space trajectory; and reconstructing an MR image from the MR image data and displaying the image to a user.

9. The method of claim 8 further comprising defining the k-space trajectory to be one of an inherently refocusing trajectory or a composite of refocusing sub-trajectories.

10. The method of claim 8 further comprising defining the k-space trajectory to have an acceleration factor.

11. The method of claim 8 wherein designing the at least one multi-channel, multi-dimensional spatially-selective RF pulse using a linear approximation comprises designing the at least one multi-channel, multi-dimensional spatially-selective RF pulse to have at least one of a large flip angle and an irregularly-shaped flip angle profile.

12. The method of claim 8 further comprising receiving at least one user parameter describing the at least one multi-channel, multi dimensional spatially-selective RF pulse to be designed and determining a desired flip angle profile based on the at least one user parameter.

13. The method of claim 8 wherein the linear approximation describes an RF pulse according to:

$$\theta(r) = \gamma \sum_{l=1}^{L} s_l^*(r) \int_0^T B_1^{(l)*}(t) e^{-ik(t) \cdot r} dt.$$

14. The method of claim 8 wherein designing the at least one multi-channel, multi-dimensional spatially-selective RF pulse using a linear approximation includes discretizing a time axis of the at least one multi-channel, multi-dimensional spatially-selective RF pulse and calculating a plurality of discrete values which plot a shape of the at least one multi-channel, multi-dimensional spatially-selective RF pulse.

15. A computer-readable storage medium having a set of instructions stored thereon which, when executed by a computer, cause the computer to:

characterize a waveform for a multi-channel, multi-dimensional spatially-selective RF pulse using a linear equation;

determine a refocusing k-space trajectory for the waveform;

instruct an MR apparatus to transmit an RF pulse according to the waveform and k-space trajectory; and acquire MR data resulting from transmission of the RF pulse.

16. The computer-readable storage medium of claim 15 wherein the instructions further cause the computer to prompt a user to identify at least one parameter describing the multi-channel, multi-dimensional spatially-selective RF pulse or prompt the user to identify a desired flip angle profile for the multi-channel, multi-dimensional spatially-selective RF pulse.

17. The computer-readable storage medium of claim 15 wherein the instructions further cause the computer to determine the refocusing k-space trajectory as one of an inherently refocusing trajectory or a composite of refocusing sub-trajectories.

18. The computer-readable storage medium of claim 15 wherein the linear equation represents a large class large tip angle (LCLTA) approximation.

19. The computer-readable storage medium of claim 15 wherein the waveform has at least one of a large flip angle and an irregularly-shaped flip angle profile.

20. The computer-readable storage medium of claim 15 wherein the refocusing k-space trajectory has an acceleration factor.

* * * * *